(12) United States Patent
Cusson et al.

(10) Patent No.: US 6,800,562 B1
(45) Date of Patent: Oct. 5, 2004

(54) METHOD OF CONTROLLING WAFER CHARGING EFFECTS DUE TO MANUFACTURING PROCESSES

(75) Inventors: Brian K. Cusson, Austin, TX (US); Thomas J. Sonderman, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/382,139

(22) Filed: Mar. 5, 2003

(51) Int. Cl.[7] .................................... H01L 21/461
(52) U.S. Cl. .................. 438/714; 438/717; 438/14
(58) Field of Search ................. 438/714, 706–713

(56) References Cited

U.S. PATENT DOCUMENTS

2003/0228532 A1 * 12/2003 Mui et al. ................. 430/30

* cited by examiner

Primary Examiner—Dung A. Le
(74) Attorney, Agent, or Firm—Williams, Morgan & Amerson, P.C.

(57) ABSTRACT

The present invention is generally directed to various methods of controlling wafer charging effects due to manufacturing processes, and a system for performing same. In one illustrative embodiment, the method comprises identifying a process metric associated with a process operation that is capable of generating a charge that is stored in at least one of a process layer and a feature formed above a substrate. In other embodiments, the method involves establishing a metric for a plasma-based process operation. The methods include establishing an allowable range for the process metric based upon data obtained from at least one electrical test performed on at least one semiconductor device subjected to the process operation, performing the process operation and indicating an alarm condition if the process metric associated with the process operation is not within the allowable range.

37 Claims, 3 Drawing Sheets

METHOD OF CONTROLLING WAFER CHARGING EFFECTS DUE TO MANUFACTURING PROCESSES

BACKGROUND OF THE INVENTION

1. Field of the Invention

The present invention is generally related to the field of semiconductor manufacturing and, more particularly, to a method of controlling wafer charging effects due to manufacturing processes, and a system for performing same.

2. Description of the Related Art

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

As device dimensions have continued to decrease, the ability to precisely form very small features to their desired dimension has become more important. Variations in the physical dimensions of such features can adversely impact device performance and reduce product yields. For example, the critical dimension and profile of gate electrode structures of transistors is one area where a very high degree of precision is desired. Absent precise control of such dimensions, adverse consequences may follow. For example, if the critical dimension of the gate electrode is greater than the target or design critical dimension, the transistor may not operate as fast as desired by the product design requirements. Conversely, if the critical dimension of the gate electrode structure is less than the target value, standby leakage currents may be higher than desired. This situation is particularly problematic for integrated circuit devices intended for mobile telecommunication applications and those intended for mobile computing devices.

Various manufacturing processes, such as etching, photolithography, deposition, heating and ion implantation processes, may be performed many times during the course of manufacturing integrated circuit products. Some of these processes may involve a charging mechanism that may introduce charged ions into the substrate or adjacent areas or structures. For example, some of these processes may involve the generation of a plasma, e.g., reactive ion etching, plasma enhanced chemical vapor deposition (PECVD), etc. As a more specific example, a plasma etching process, typically anisotropic in nature, may be performed to define a polysilicon gate electrode on a transistor and a floating gate or control gate on a flash memory device.

During the performance of such processes, an undesirable charge may be stored on part of the device or material, e.g., on a layer of insulating material, such as silicon dioxide, on a polysilicon gate electrode, on a deposited layer of polysilicon, or a combination thereof, etc. This is sometimes referred to as wafer charging. The wafer may also be subjected to charging via static charging and surface charging mechanisms.

Wafer charging is undesirable from many points of view. For example, such wafer charging may alter the electrical characteristics of the particular device manufactured. By way of example, due to wafer charging, the threshold voltage ($V_T$) of a transistor may be different than the value expected by the design process, i.e., the actual threshold voltage of the manufactured device may be less than or greater than anticipated. Variations in such electrical parameters may ultimately adversely impact or degrade device performance.

The present invention is directed to overcoming, or at least reducing the effects of, one or more of the problems set forth above.

SUMMARY OF THE INVENTION

The present invention is generally directed to various methods of controlling wafer charging effects due to manufacturing processes, and a system for performing same. In one illustrative embodiment, the method comprises identifying a process metric associated with a process operation that is capable of generating a charge that is stored in at least one of a process layer and a feature formed above a substrate, establishing an allowable range for the process metric based upon data obtained from at least one electrical test performed on at least one semiconductor device subjected to the process operation, performing the process operation and indicating an alarm condition if the process metric associated with the process operation is not within the allowable range.

In a further illustrative embodiment, the method comprises identifying a process metric associated with a process operation that involves generation of a plasma, establishing an allowable range for the process metric based upon data obtained from at least one electrical test performed on at least one semiconductor device subjected to the process, performing the process operation on a semiconducting substrate, and indicating an alarm condition if the process metric associated with the process operation is not within the allowable range.

In another illustrative embodiment, the method comprises identifying a process metric associated with a process operation that involves generation of a plasma, establishing an allowable range for the process metric based upon data obtained from at least one electrical test performed on at least one semiconductor device subjected to the process, performing the process operation on a semiconducting substrate, and adjusting at least one parameter of the process operation if the process metric is not within an allowable range.

In yet another illustrative embodiment, the method comprises identifying a process metric associated with a process operation that involves generation of a plasma, establishing an allowable range for the process metric based upon data obtained from at least one electrical test performed on at least one semiconductor device subjected to the process, performing the process operation on a semiconducting substrate, determining a value for the process metric during the process operation performed on the semiconducting substrate, and performing a subsequent process operation on the processed semiconducting substrate to reduce electrical charge stored in at least one of a process layer and a feature formed during the process operation if the process metric is not within an allowable range.

In still a further illustrative embodiment, the method comprises identifying a process metric associated with a plasma etching process operation, establishing an allowable range for the process metric based upon data obtained from at least one electrical test performed on at least one semiconductor device subjected to the plasma etching process operation, performing the plasma etching process operation on a semiconducting substrate, and indicating an alarm condition if the process metric associated with the plasma etching process operation is not within an allowable range.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various features of a semiconductor device are depicted in the drawings as having very precise, sharp configurations and profiles, those skilled in the art recognize that, in reality, these features are not as precise as indicated in the drawings. Additionally, the relative sizes of the various features depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase In general, the present invention is directed to various methods of controlling wafer charging effects due to manufacturing processes, and a system for performing same. As will be readily apparent to those skilled in the art upon a complete reading of the present application, the present methods are applicable to a variety of technologies, e.g., NMOS, PMOS, CMOS, SOI, etc., and the methods disclosed herein may be used in the formation of a variety of different types of integrated circuit products and devices, including, but not limited to, logic devices, memory devices, transistors, memory cells, etc.

During the course of manufacturing semiconductor devices, e.g., transistors, memory cells, etc., one or more process operations may be performed that result in undesirable wafer charging. Such processes typically involve a charging mechanism that may introduce charged ions into a layer of material, a formed feature, the substrate and/or surrounding areas or structures, etc. Such processes may involve generation of a plasma, e.g., a plasma etching process, a plasma enhanced deposition process, etc. Such wafer charging may also occur during ion implant processes. As one illustrative example, a layer of polysilicon (polycrystalline silicon) may be subject to an anisotropic plasma etching process to define a plurality of structures such as gate electrodes for transistors, floating gates or control gates for a memory device, etc. During such plasma-based processes, electrons may be introduced into and stored in the substrate, the gate insulation layer (silicon dioxide) and/or the polysilicon gate electrode structure, i.e., a charge may be stored in the polysilicon/oxide structure or adjacent areas. Such undesirable charging may also be present in a layer of material, e.g., nitride, oxide, TEOS, etc., that is formed by, for example, a plasma-based deposition process, e.g., plasma enhanced chemical vapor deposition (PECVD), a high density plasma process (HDP), etc. Such charging may also occur during ion implant processes.

Figure 1:
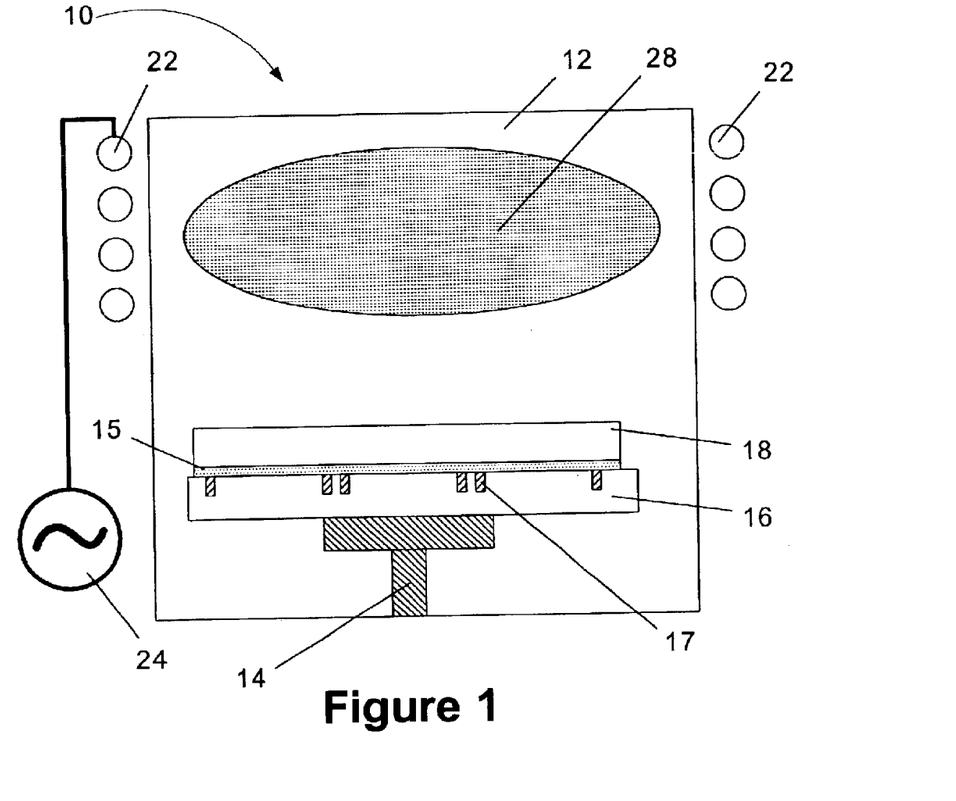
FIG. 1 is a cross-sectional, schematic depiction of an illustrative process tool, such as a deposition tool, that may be employed with the present invention.

FIG. 1 is a cross-sectional, schematic depiction of a process tool 10, e.g., a plasma-based deposition tool, that may be employed to form various process layers, e.g., a layer of insulating material, a layer of polysilicon, etc. The deposition tool 10 is comprised of a process chamber 12, a wafer stage 14, an RF coil 22, and an RF power source 24. Of course, the deposition tool 10 may include many additional features, such as pressure and temperature sensors, process gas inlets and outlets, etc. These additional features are not depicted so as not to obscure the present invention.

A deposition process will be performed in the deposition tool 10 to form a process layer 18 above a wafer 16. The process layer 18 may be comprised of a variety of materials, e.g., a layer of insulating material, a layer of silicon nitride, a layer of polysilicon, etc. As will be understood by those skilled in the art after a complete reading of the present application, the present invention is not limited to the formation of any particular type of process layer. Moreover, the process layer 18 may be formed above one or more previous layers 15. For example, the process layer 18 may be a layer of polysilicon that is formed above a previously formed gate insulation layer comprised of silicon dioxide. A plurality of trench isolation regions 17 may also be formed in the wafer 16.

During the deposition process, a plasma, or glow discharge, 28 is generated in the deposition tool 10 by, among other things, supplying RF power from the RF power source 24 to the coils 22 positioned proximate the process chamber 12. A plasma is generally understood to be a partially ionized gas containing an approximately equal number of positive and negative charges as well as some number of neutral gas atoms and molecules. A glow discharge is generally understood to be a self-sustaining type of plasma. As will be appreciated by those skilled in the art after a complete reading of the present application, the present invention may be employed with any type of tool that generates and uses a plasma 28 in performing its intended functions. As used herein, the term "plasma" should be understood to cover any glow discharge process or plasma process employed in semiconductor manufacturing operations.

Figure 2:
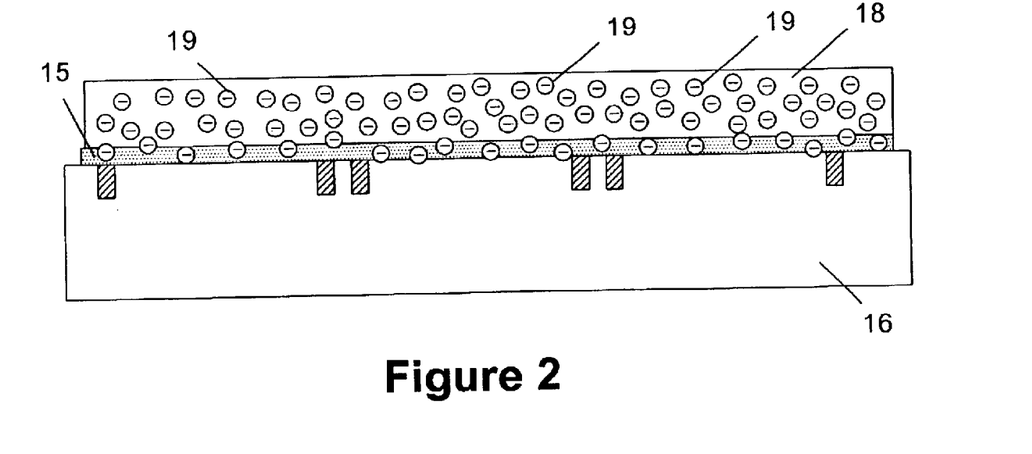
FIG. 2 is a cross-sectional view of a substrate having a process layer formed there-above using a plasma-based deposition process.

As a result of the processing performed in the deposition tool 10, an undesirable charge, as indicated by the schematically depicted electrons 19 in FIG. 2, may be stored in the wafer 16, the process layer 18 and/or the additional layer 15. The magnitude and polarity of the undesired charge stored on the wafer 16 may vary depending on the application, e.g., an undesirable positive or negative charge may be stored on the process layer 18 and/or the additional layer .15, e.g., a gate insulation layer. Such undesirable charging may occur on a periodic basis or random basis. Thus, there may be situations where the undesirable wafer charging does not occur on every substrate processed in the process tool, or it may happen on a very infrequent basis. In other cases, the undesirable wafer charging may occur frequently.

Figure 3:
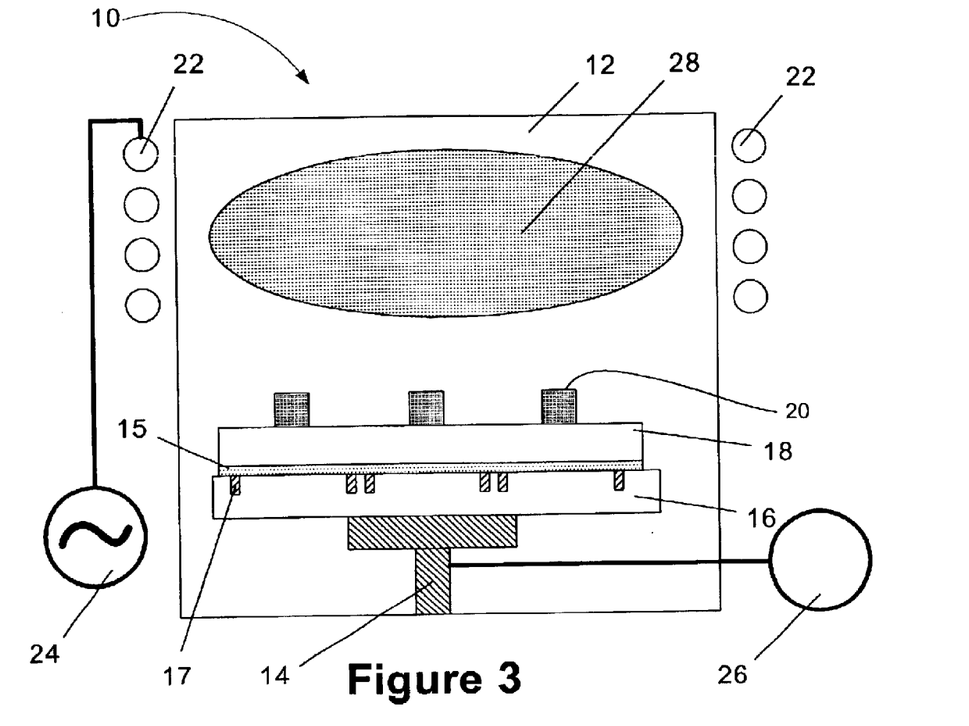
FIG. 3 is a cross-sectional view of yet another illustrative process tool, such as an etching tool, that may be employed with the present invention.

FIG. 3 is a cross-sectional, schematic depiction of a process tool 10, e.g., an etch tool, that may be employed to form various features of a semiconductor device. As shown in FIG. 3, the etch tool is comprised of a process chamber 12A, a wafer stage 14A, an RF coil 22A, an RF power source 24A and a DC power source 26. As will be appreciated by those skilled in the art, the etch tool comprises many additional features, e.g., temperature sensors, pressure sensors, process gas inlets and outlets, means for providing one or more process gases to the tool, etc., which are not depicted so as to not obscure the present invention. A wafer 16, having a process layer 18 formed thereabove, e.g., a layer of polysilicon, is positioned above and secured to the wafer stage 14A by, for example, a vacuum source (not shown). The wafer 16 and/or process layers 18, 15 may or may not have an undesirable charge stored therein prior to being positioned in the etch tool. A patterned masking layer 20 is formed above the process layer 18. Of course, the present invention may be employed in situations where the patterned masking layer 20 is comprised of a photoresist material (positive or negative) as well as other so-called hard mask materials, e.g., silicon nitride. A plasma, or glow discharge, 28 is generated in the etch tool by, among other things, supplying RF power from the RF power source 24A to the coils 22A positioned proximate the process chamber 12A.

Figure 4:
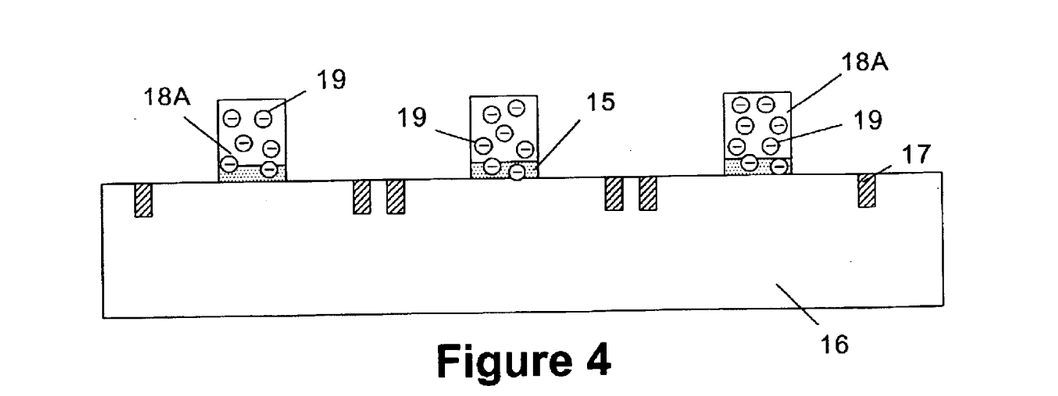
FIG. 4 is a cross-sectional view of a semiconducting substrate that has been subjected to a plasma etching process performed in a plasma-based etching tool.

As a result of the etch processing in the etch tool, a plurality of features 18A are formed above the wafer 16, as shown in FIG. 4. In one illustrative embodiment, the features 18A are gate electrode structures for a plurality of transistor devices to be formed on the wafer 16. Of course, it should be understood that the features 18A are representative in nature, i.e., they may represent any feature formed above a semiconducting substrate during which the device is subjected to undesirable wafer charging. For example, the features 18A may also be gate insulation layers for transistors, features formed in a layer of insulating material, floating gate or control gate structures on a memory device, such as a flash memory product. The features may also be understood to be a collection of structures, such as a layer of silicon dioxide (gate insulation layer) and a polysilicon gate electrode formed thereabove.

As a result of the processing performed in the tool 10, an undesirable charge, as indicated by the schematically depicted electrons 19, is stored on or within the features 18A, i.e., the gate electrode and/or the gate insulation layer. The magnitude and polarity of the undesired charge stored on the wafer may vary depending upon the application, i.e., an undesirable positive charge could be stored on the features 18A.

Figure 5:
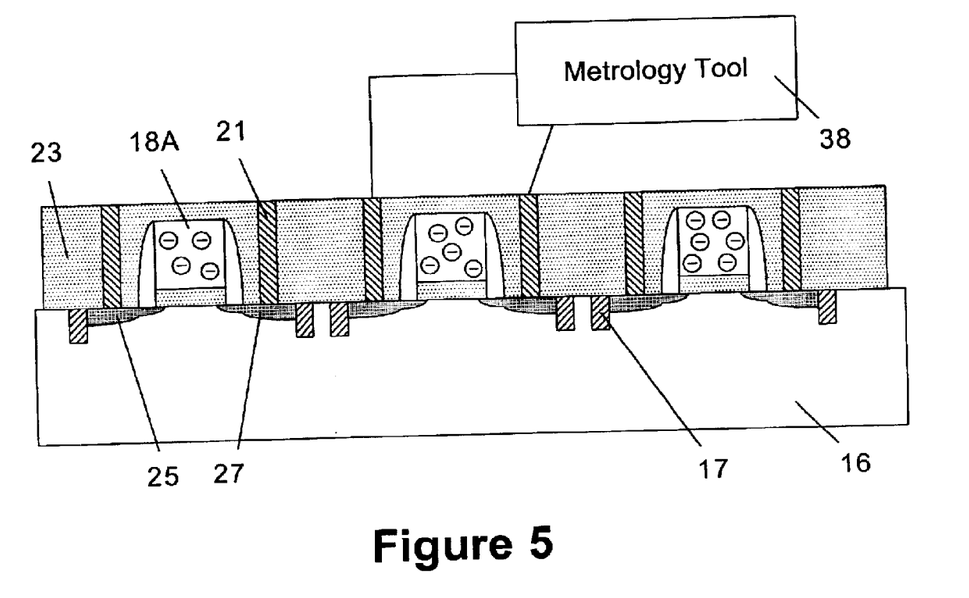
FIG. 5 is the substrate of FIG. 4 after additional processing operations have been performed thereon.

After the features 18A are formed, additional process operations may be performed to complete the formation of a semiconductor device, e.g., a transistor or a memory cell, in whole or part. Such processes may include performing one or more ion implant processes to form a plurality of doped regions (e.g., source/drain regions) in the substrate, forming additional layers of material, performing one or more etching processes, etc. Eventually, processing operations will be performed until the device may be subjected to various electrical tests to be described more fully below. For example, as depicted in FIG. 5, additional processing operations may be performed until a plurality of contacts 21 are formed in a layer of insulating material 23, e.g., silicon dioxide. The contacts 21 are electrically coupled to the various portions of the device, i.e., to the source region 25, the drain region 27 and/or the gate electrode 18A of the illustrative transistors depicted in FIG. 3. This level of contacts 21 may generally be referred to as "metal 1 level" or "contact level-" At this point, if desired, a metrology tool 38 may be used to perform various electrical tests on one or more of the devices to determine the amount of wafer charging and/or one or more electrical characteristics of the completed device, e.g., threshold voltage, breakdown voltage, leakage current, erase time, erase speed, reference voltage, drive current, capacitance values, etc. Such testing may generally be referred to as "in-line" testing. Additionally, the device may be subjected to additional testing after the device has been completed and/or packaged if desired. Various control actions may be taken based upon this electrical testing data.

The plasma generated in the process tool(s) may exhibit several characteristics. These characteristics include, but are not limited to, the mean free path of electrons generated by the plasma, the temperature of the electrons, the density of the plasma, the electric field, the dark space, the percentage of ionized gases, ionization potentials, the charges of the gases used in the plasma process (+, 2+, –, etc.), the stoichiometric chemical composition of the plasma and the plasma feed gases, the presence and/or absence of specific chemical species, molecules or atoms, floating potential, electron mobilities, sheath voltage, discharge diameter, magnetic moment, debye length, etc. The plasma characteristics of interest may vary depending upon whether the process is a deposition process or an etching process. Thus, the present invention should not be considered as limited to monitoring or using any specific parameter or characteristic of the plasma unless such limitations are expressly set forth in the appended claims.

There are products in the marketplace that may be used to obtain data about the characteristics of the plasma 28. For example, optical emission spectrometry tools, mass spectrometry tools, Langmier probes, RF sensors, etc., may be employed to obtain data about the characteristics of the plasma 28. These types of tools may be obtained from a variety of known vendors. Once obtained, this data regarding the characteristics of the plasma 28 may be used in accordance with the methods described herein.

Moreover, various aspects of the present invention may be employed with any of a variety of processes employing a plasma, such as, for example, plasma deposition processes, plasma etching processes, reactive ion etching processes, inductively coupled plasma etching processes, high density plasma tools, etc. Additionally, as used herein, the term "plasma" should be understood to cover any glow discharge process or plasma process employed in semiconductor manufacturing operations. The present invention may also be employed with ion implantation processes where undesirable wafer charging occurs. Thus, the present invention should not be considered as limited to any particular type of tool or process unless such limitations are clearly set forth in the appended claims.

Figure 6:
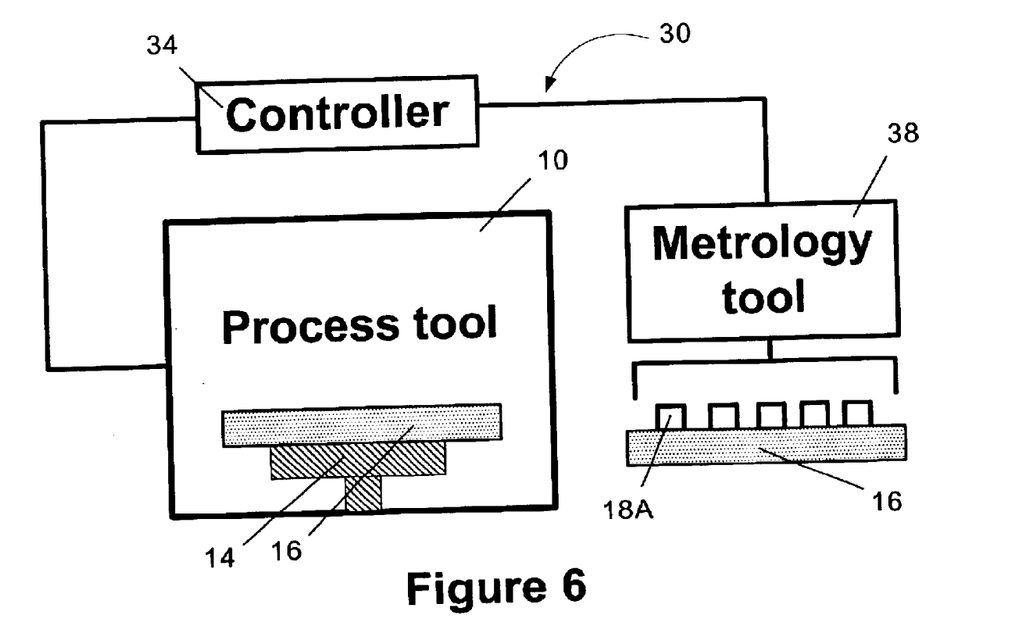
FIG. 6 is a block diagram, schematic depiction of a system in accordance with one illustrative embodiment of the present invention.

FIG. 6 depicts an illustrative system 30 that may be employed with the present invention. In general, in one embodiment, the system 30 is comprised of a process tool 10, a controller 34 and a metrology tool 38. The process tool 10 may be any type of tool in which the process performed therein results in the undesirable charging of the wafer. For example, the process tool 10 may be a deposition tool capable of performing a plasma-based deposition process or it may be an etching tool capable of performing a plasma-based etching process. The process tool 10 may also be an ion implant tool that is capable of performing a process that results in undesirable charging of the wafer during processing. In one embodiment, the controller 34 is adapted to undertake various control actions with respect to the process tool 10. For example, the controller 34 may act to control or vary one or more parameters of the process operation performed in the tool 10. Such parameters may include, but should not be considered as limited to, one or more gas flow rates, temperature, pressure, power supplied to generate a plasma, the positioning of the schematically depicted wafer 16 within the tool 10, the DC power supplied to the illustrative wafer stage 14, wafer chuck temperature, wafer backside coolant gas flow, process duration, throttle valve position, electrode gap (the distance between the upper electrode and the wafer surface), wafer bias, etc. The controller 34 may be resident on the process tool 10, it may be a stand-alone computer, or it may be part of a factory-wide computer system that is used to control the various processes within a semiconductor manufacturing plant. The process tool 10 may be any type of process tool used in manufacturing a semiconductor device wherein a plasma is generated in the tool during processing. For example, the process tool 10 may be a plasma etching tool or a tool adapted to perform a plasma enhanced chemical vapor deposition process.

Additional inputs may be provided to the controller 34, such as wafer state data, tool state data and process state data, although such inputs are not expressly depicted in FIG. 5. For example, wafer state data may include parameters such as film thicknesses, critical dimensions and/or profiles of features, the height of features, the depth of features, the chemical composition of the layer to be etched in the tool 10, wafer temperature, etc. The tool state data may involve items such as RF power, DC power, pressure, electrode gap, etc. Process state data may include the plasma characteristics described above.

In one embodiment, the metrology tool 38 may be any type of tool capable of measuring an electrical characteristic or parameter that reflects or may be used to determine or infer the existence, magnitude and/or polarity of undesirable charge stored on the wafer. Such electrical testing may include directly measuring the stored charged on one or more features, breakdown voltage, threshold voltage, leakage current, erase time, erase speed, reference voltage, drive current, capacitance values, etc. The metrology tool 38 may be a stand-alone tool or it may be an integrated metrology tool capable of providing metrology data on wafers processed in the tool 10. In addition, metrology data can be provided by in situ metrology systems and sensors as the wafer is processed or with the process chamber itself. The metrology tool 38 may be, for example, a surface photovoltage tool, a volt meterbased tool, an amp meter-based tool, etc.

In the illustrated embodiments, the controller 34 is a computer programmed with software to implement the functions described herein. Moreover, the functions described for the controller 34 may be performed by one or more controllers spread through the system. For example, the controller 34 may be a fab level controller that is used to control processing operations throughout all or a portion of a semiconductor manufacturing facility. Alternatively, the controller 34 may be a lower level computer that controls only portions or cells of the manufacturing facility. Moreover, the controller 34 may be a stand-alone device, or it may reside on the process tool 10 or elsewhere within the system. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities- Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer systems' registers and memories into other data similarly represented as physical quantities within the computer system memories or registers or other such information storage, transmission or display devices.

An exemplary software system capable of being adapted to perform the functions of the controller 34, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699 Provisional Specification for CIM Framework Domain Architecture) and APC (SEMI E93-0999-Provisional Specification for CIM Framework Advanced Process Control Component) specifications are publicly available from SEMI.

In one illustrative embodiment, the method comprises identifying a process metric associated with a process operation that is capable of generating a charge that is stored in at least one of a process layer and a feature formed above a substrate, establishing an allowable range for the process metric based upon data obtained from at least one electrical test performed on at least one semiconductor device subjected to the process operation, performing the process operation and indicating an alarm condition if the process metric associated with the process operation is not within the allowable range.

In another illustrative embodiment, a metric may be established for the plasma-based operation performed on the tool that reflects the state of processing within the tool. For example, with respect to plasma-based processes, the metric may be established for one or more characteristics of the plasma during processing. For example, such a metric may be based on or include at least one of the characteristics of the plasma which were identified previously, or a combination of such factors. Moreover, different weighting may be applied to the various factors or characteristics of the plasma generated in the process tool. This metric may also be based upon tool state data and/or wafer state data.

Once this process metric is established, it may be correlated with the electrical test data obtained by the metrology tool 38. That is, by various known modeling techniques, the metric associated with the process operation performed in the process tool may be associated with semiconductor devices exhibiting the desired electrical characteristics or range of such characteristics, such as a reduction or elimination of undesirable wafer charging. In this embodiment, the controller 34 may monitor the process metric associated with the process operation performed in the process tool and indicate an alarm condition if the metric falls outside of a preselected allowable range. This preselected allowable range may be established based upon electrical test data obtained using the metrology tool 38. More specifically, based upon the electrical test data, an allowable range for the process metric may be established wherein the resulting semiconductor devices exhibit the desired electrical characteristics, e.g., little or no wafer charging. The allowable range of the process metric may also be based upon electrical test data that indicates that the resulting semiconductor devices exhibit electrical characteristics, e.g., threshold voltage, within acceptable limits. That is, in this embodiment, the controller 34 may act as a fault detection unit to indicate when the plasma-based processing may be performing outside of a desirable range. Such out-of-tolerance processing, if allowed to continue, may result in the production of semiconductor devices exhibiting undesirable levels of wafer charging and/or electrical performance characteristics that are not acceptable for the devices under construction. If such a condition occurs, processing operations in the process tool 10 may be stopped, or maintenance procedures may be performed on the tool 10.

In another illustrative embodiment, the electrical test data may be used by the controller 34 in a feedback control loop to control the operation of the process tool 10 such that the process metric is maintained within an operating range that produces semiconductor devices exhibiting the desired electrical characteristics, e.g., reduced wafer charging, threshold voltage at a desired level or range, etc. In this embodiment, if the electrical test data obtained by the metrology tool 38 indicates that the process tool 10 is producing semiconductor devices that exhibit undesirable electrical characteristics, then the controller 34 may act to adjust one or more parameters of the process operation performed in the process tool 10. In one embodiment, the controller 34 may be used to detect degradation in the electrical characteristics of devices resulting from the processing performed in the process tool 10, and it may take various control actions prior to the electrical characteristics of the resulting devices actually exceeding preselected allowable limits.

In another aspect, the present invention may be employed to compensate for unwanted wafer charging effects. For example, based upon the electrical test data obtained by the metrology tool 38, the degree of undesirable wafer charging may be determined or quantified. In turn, a compensatory action may be taken to reduce or eliminate the undesirable charge. For example, based upon the electrical test data, an ultraviolet erase procedure may be performed on the devices, e.g., memory devices, to reduce or eliminate the undesirable wafer charging. However, in some cases, it may not be possible to erase the stored charges.

The present invention is directed to various methods and systems for controlling undesirable wafer charging. In one illustrative embodiment, the method comprises identifying a process metric associated with a process operation that involves generation of a plasma, establishing an allowable range for the process metric based upon data obtained from at least one electrical test performed on at least one semiconductor device subjected to the process, performing the process operation on a semiconducting substrate, and indicating an alarm condition if the process metric associated with the process operation is not within the allowable range.

In another illustrative embodiment, the method comprises identifying a process metric associated with a process operation that involves generation of a plasma, establishing an allowable range for the process metric based upon data obtained from at least one electrical test performed on at least one semiconductor device subjected to the process, performing the process operation on a semiconducting substrate, and adjusting at least one parameter of the process operation if the process metric is not within an allowable range.

In yet another illustrative embodiment, the method comprises identifying a process metric associated with a process operation that involves generation of a plasma, establishing an allowable range for the process metric based upon data obtained from at least one electrical test performed on at least one semiconductor device subjected to the process, performing the process operation on a semiconducting substrate, determining a value for the process metric during the process operation performed on the semiconducting substrate, and performing a subsequent process operation on the processed semiconducting substrate to reduce electrical charge stored in at least one of a process layer and a feature formed during the process operation if the process metric is not within an allowable range.

In still a further illustrative embodiment, the method comprises identifying a process metric associated with a plasma etching process operation, establishing an allowable range for the process metric based upon data obtained from at least one electrical test performed on at least one semiconductor device subjected to the plasma etching process operation, performing the plasma etching process operation on a semiconducting substrate, and indicating an alarm condition if the process metric associated with the plasma etching process operation is not within an allowable range.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   identifying a process metric associated with a process operation that involves generation of a plasma;
   establishing an allowable range for said process metric based upon data obtained from at least one electrical test performed on at least one semiconductor device subjected to said process operation;
   performing said process operation; and
   indicating an alarm condition if said process metric associated with said process operation is not within said allowable range.

2. The method of claim 1, further comprising adjusting at least one parameter of said process operation if said process metric is not within said allowable range.

3. The method of claim 1, wherein said process operation is comprised of at least one of an etching process and a deposition process.

4. The method of claim 1, wherein said process operation is a plasma deposition process that is performed to form a layer of material.

5. The method of claim 1, wherein said process operation is a plasma etching process that is performed to form at least one of a gate electrode, a floating gate and a control gate.

6. The method of claim 1, wherein establishing said allowable range for said process metric comprises establishing said allowable range for said metric such that charging from the performance of said process operation is reduced.

7. The method of claim 1, wherein said process metric associated with said process operation is based upon at least one of a gas flow rate, a temperature, a pressure, a power supplied to generate said plasma, a positioning of a wafer within a tool used in performing said process operation, a power level supplied to a wafer stage, a process duration, an electrode gap and a wafer bias.

8. The method of claim 1, wherein said at least one electrical test is performed to determine at least one of an electrical charge stored in a feature, an electrical charge stored in a deposited layer of material, an electrical charge stored on a gate electrode, an electrical charge stored on a floating gate of a memory device, a threshold voltage of a transistor, a leakage current of a transistor, an erase time for a memory device, an erase speed for a memory device, a reference voltage, a drive current and a capacitance value.

9. The method of claim 1, wherein said at least one electrical test is performed on said at least one semiconductor device prior to fabrication of said at least one semiconductor device being complete.

10. The method of claim 1, wherein said at least one electrical test is performed on said at least one semiconductor device after fabrication of said at least one semiconductor device is complete.

11. The method of claim 1, wherein said at least one electrical test is performed on said at least one semiconductor device after a first level of conductive contacts that are electrically coupled to said semiconductor device are formed.

12. The method of claim 1, further comprising performing a subsequent process operation on said processed semiconducting substrate to reduce electrical charge stored in at least one of a process layer and a feature formed during said process operation.

13. The method of claim 12, wherein said subsequent process operation is comprised of an ultraviolet erase process.

14. A method, comprising:
   identifying a process metric associated with a process operation that involves generation of a plasma;
   establishing an allowable range for said process metric based upon data obtained from at least one electrical test performed on at least one semiconductor device subjected to said process operation;
   performing said process operation; and
   adjusting at least one parameter of said process operation if said process metric is not within said allowable range.

15. The method of claim 14, wherein said process operation is comprised of at least one of an etching process and a deposition process.

16. The method of claim 14, wherein said process operation is a plasma deposition process that is performed to form a layer of material.

17. The method of claim 14, wherein said process operation is a plasma etching process that is performed to form at least one of a gate electrode, a floating gate and a control gate.

18. The method of claim 14, wherein establishing said allowable range for said process metric comprises establishing said allowable range for said metric such that charging from the performance of said process operation is reduced.

19. The method of claim 14, wherein said process metric associated with said process operation is comprised of at least one of a gas flow rate, a temperature, a pressure, a power supplied to generate said plasma, a positioning of a wafer within a tool used in performing said process operation, a power level supplied to a wafer stage, a process duration, an electrode gap and a wafer bias.

20. The method of claim 14, wherein said at least one electrical test is performed to determine at least one of an electrical charge stored in a feature, an electrical charge stored in a deposited layer of material, an electrical charge stored on a gate electrode, an electrical charge stored on a floating gate of a memory device, a threshold voltage of a transistor, a leakage current of a transistor, an erase time for a memory device, an erase speed for a memory device, a reference voltage, a drive current and a capacitance value.

21. The method of claim 14, wherein said at least one electrical test is performed on said at least one semiconductor device prior to fabrication of said at least one semiconductor device being complete.

22. The method of claim 14, wherein said at least one electrical test is performed on said at least one semiconductor device after fabrication of said at least one semiconductor device is complete.

23. The method of claim 14, wherein said at least one electrical test is performed on said at least one semiconductor device after a first level of conductive contacts that are electrically coupled to said semiconductor device are formed.

24. The method of claim 14, further comprising performing a subsequent process operation on said processed semiconducting substrate to reduce electrical charge stored in at least one of a process layer and a feature formed during said process operation.

25. The method of claim 24, wherein said subsequent process operation is comprised of an ultraviolet erase process.

26. A method, comprising:
   identifying a process metric associated with a process operation that involves generation of a plasma;
   establishing an allowable range for said process metric based upon data obtained from at least one electrical test performed on at least one semiconductor device subjected to said process;
   performing said process operation on a semiconducting substrate;
   determining a value for said process metric for said process operation performed on said semiconductor substrate; and
   performing a subsequent process operation on said processed semiconducting substrate to reduce electrical charge stored in at least one of a process layer and a feature formed during said process operation if said process metric is not within said allowable range.

27. The method of claim 26, further comprising adjusting at least one parameter of said process operation if said process metric is not within said allowable range.

28. The method of claim 26, wherein said process operation is comprised of at least one of an etching process and a deposition process.

29. The method of claim 26, wherein said process operation is a plasma deposition process that is performed to form a layer of material.

30. The method of claim 26, wherein said process operation is a plasma etching process that is performed to form at least one of a gate electrode, a floating gate and a control gate.

31. The method of claim 26, wherein establishing said allowable range for said process metric comprises establishing said allowable range for said metric such that charging from the performance of said process operation is reduced.

32. The method of claim 26, wherein said process metric associated with said process operation is comprised of at least one of a gas flow rate, a temperature, a pressure, a power supplied to generate said plasma, a positioning of a wafer within a tool used in performing said process operation, a power level supplied to a wafer stage, a process duration, an electrode gap and a wafer bias.

33. The method of claim 26, wherein said at least one electrical test is performed to determine at least one of an electrical charge stored in a feature, an electrical charge stored in a deposited layer of material, an electrical charge stored on a gate electrode, an electrical charge stored on a floating gate of a memory device, a threshold voltage of a transistor, a leakage current of a transistor, an erase time for a memory device, an erase speed for a memory device, a reference voltage, a drive current and a capacitance value.

34. The method of claim 26, wherein said at least one electrical test is performed on said at least one semiconductor device prior to fabrication of said at least one semiconductor device being complete.

35. The method of claim 26, wherein said at least one electrical test is performed on said at least one semiconductor device after fabrication of said at least one semiconductor device is complete.

36. The method of claim 26, wherein said at least one electrical test is performed on said at least one semiconductor device after a first level of conductive contacts that are electrically coupled to said semiconductor device are formed.

37. The method of claim 26, wherein said subsequent process operation is comprised of an ultraviolet erase process.

* * * * *